United States Patent [19]

Berger et al.

[11] 4,323,791

[45] Apr. 6, 1982

[54] SUBSTRACTION AND CHARGE QUANTITY GENERATION CHARGE TRANSFER DEVICE

[75] Inventors: Jean L. Berger; Jean L. Coutures, both of Paris, France

[73] Assignee: Thomson-CSF, Paris, France

[21] Appl. No.: 144,855

[22] Filed: Apr. 29, 1980

[30] Foreign Application Priority Data

May 4, 1979 [FR] France ................. 79 11315

[51] Int. Cl.³ .................. G11C 19/28; H01L 29/78
[52] U.S. Cl. .................. 307/221 D; 357/24
[58] Field of Search .................. 357/24; 307/221 D

[56] References Cited

U.S. PATENT DOCUMENTS 4,047,051  9/1977  Heller ................ 357/24
4,104,543  8/1978  Meading ............ 307/221 D
4,239,983  12/1980 Edwards et al. .... 307/221 D Primary Examiner—Gene M. Munson
Attorney, Agent, or Firm—Roland Plottel

[57] ABSTRACT

The storage electrodes are electrically connected at a point. A reference charge quantity is stored beneath the first storage electrode when the point is at a constant potential and before charges pass beneath the second storage electrode. When a charge quantity arrives beneath the second storage electrode and when the point is floating, the surface potential beneath the first storage electrode is maintained constant and a charge quantity is transferred from the first storage electrode to a third storage electrode.

5 Claims, 4 Drawing Figures

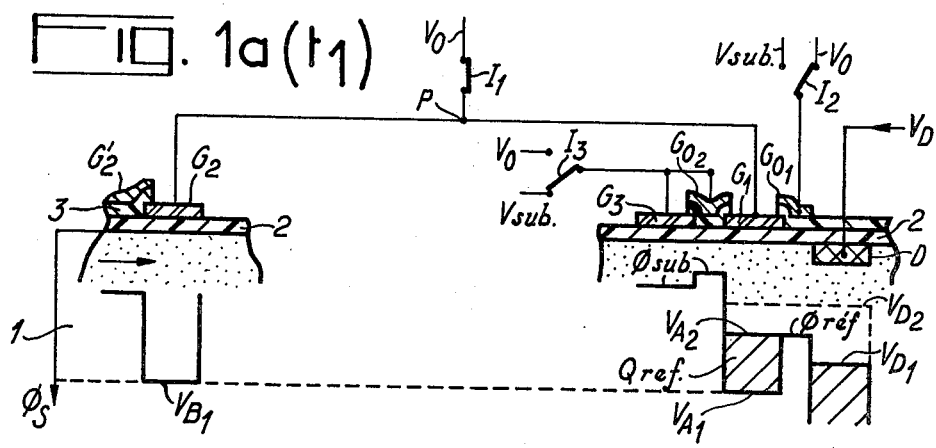
FIG. 1a(t₁)
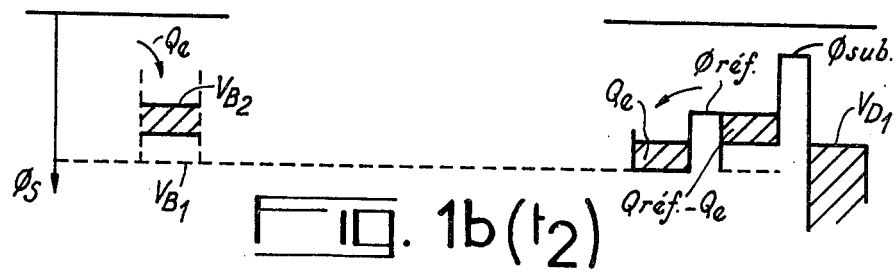
FIG. 1b(t₂)
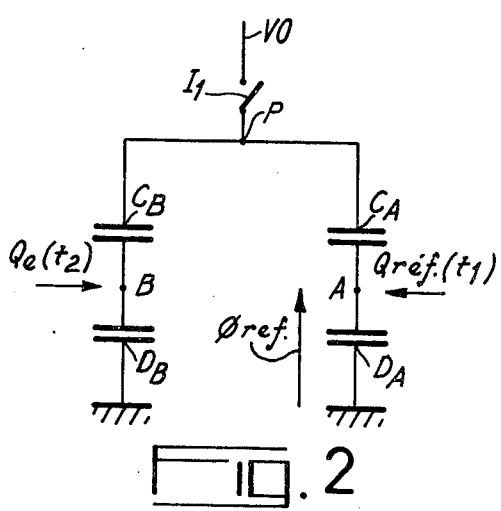
FIG. 2
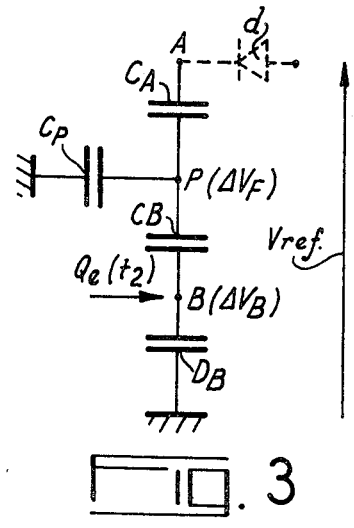
FIG. 3

SUBSTRACTION AND CHARGE QUANTITY GENERATION CHARGE TRANSFER DEVICE

BACKGROUND OF THE INVENTION

The present invention relates to a subtraction and charge quantity generation charge transfer device. It also relates to an analog signal processing charge transfer system equipped with such a device.

During the processing of analog signals by charge transfer, it is often necessary to carry out subtraction between two signals. In the prior art, the charges are generally converted into a voltage and the subtraction then takes place on the voltages. A quantity of charges corresponding to the subtraction result is then reinjected into the charge transfer system.

Conversions of charges into voltages and vice versa have the disadvantage of having only limited linearity and having a difficulty reproducible gain. Moreover, the devices used for carrying out conversions and subtractions on voltages are generally cumbersome and have a high current consumption.

BRIEF SUMMARY OF THE INVENTION

The present invention relates to a device which directly carries out the subtraction on the charge quantities.

This device has the advantage of being easy to integrate into a more complex charge transfer system. It makes it possible to obtain with a high level of accuracy a quantity of charges equal to the difference between a reference charge quantity and n charge quantities. According to a preferred embodiment, this device only requires a single polarization voltage for the storage and transfer electrodes, apart from the reference voltage of the substrate, which increases its simplicity and accuracy.

The device according to the invention also ensured with a high level of precision the generation of a quantity of charges equivalent to the n charge quantities which are substracted from the reference charge quantity.

The device according to the invention comprises a first storage electrode electrically connected to n other storage electrodes at a point P, means ensuring the injection beneath the first storage electrode of the reference charge quantity prior to the arrival of the charges beneath the n storage electrodes and when point P is at a constant voltage and means which ensure that a constant surface potential is maintained beneath the first storage electrode, during the arrival of charges beneath the n storage electrodes and when point P is left floating.

BRIEF DESCRIPTION OF THE DRAWINGS

The invention is described in greater detail hereinafter relative to non-limitative embodiments and the attached drawings, wherein show:

FIGS. 1a and 1b cross-sectional views of an embodiment of the device according to the invention and two diagrams illustrating its operation.

FIGS. 2 and 3 circuit diagrams of the embodiment of the device according to the invention shown in FIG. 1a.

DETAILED DESCRIPTION OF THE PREFERRED EMBODIMENTS

In the drawings, the same references designate the same components but, for reasons of clarity, the dimensions and proportions of the various components have not been respected.

FIG. 1a is a cross-sectional view in the charge transfer direction of an embodiment of the device according to the invention.

A silicon semiconductor substrate 1, of type P in the present embodiment, is covered with an insulating layer 2, of silicon monoxide in the present embodiment. Charge transfer and storage electrodes are arranged in alternating manner on the insulating layer 2, whereby they are positioned substantially perpendicularly to the charge transfer direction. The transfer electrodes are deposited on an insulating reinforcement 3.

As is known, this arrangement has a double function. Firstly, it ensures the continuity of the potentials created in the semiconductor and secondly it imposes a single transfer direction for the charge carriers.

The structure having the insulating reinforcement can be replaced by overdoping of the substrate by ion implantation fulfilling the same functions.

In FIG. 1a, a first storage electrode $G_1$ is electrically connected by a metallic lead, external to the substrate and generally in aluminium to a single storage electrode $G_2$. Storage electrode $G_2$ forms part of a charge transfer register into which are transferred the charge quantity or quantities to be subtracted from a reference charge quantity $Q_{ref}$. FIG. 1a only shows storage electrode $G_2$ of said register and the transfer electrode $G'_2$ which precedes $G_2$ in the charge transfer direction indicated by an arrow.

The first storage electrode $G_1$ is surrounded by two transfer electrodes $G_{01}$ and $G_{02}$. Transfer electrode $G_{01}$ is followed by a charge injection diode D constituted by a type N+ diffusion. Transfer electrode $G_{02}$ is followed by a storage electrode $G_3$.

Point P can be connected to a constant voltage $V_O$, but it can also be left floating, i.e. it need not be connected to any voltage source. Switch $I_1$ in FIG. 1a symbolically represents the two possibilities for the polarization of point P.

Grids $G_{01}$, $G_{02}$ and $G_3$ can be connected to constant voltage $V_O$ or to a voltage below $V_O$, which may have the polarization voltage of substrate $V_{sub}$. These two polarization possibilities are symbolically represented by switch $I_2$ connected to $G_{01}$ and by switch $I_3$ connected to $G_{02}$ and $G_3$.

In practice, switches $I_1$, $I_2$ and $I_3$ are generally constituted by one or more MOS transistors.

Charge injection diode D receives a polarization voltage $V_D$.

FIGS. 1a and 1b also have two diagrams illustrating the operation of the device according to the invention. These diagrams show the development of the surface potential $\phi_S$ in substrate 1. The hatched areas indicate the presence of minority carriers.

FIG. 1a shows the different surface potentials in the substrate at time $t_1$, when switches $I_1$, $I_2$ and $I_3$ are in the position indicated in FIG. 1a. At time $t_1$, point P is at constant voltage $V_O$ and the surface potential beneath the storage electrodes $G_1$ and $G_2$ is the same, said potentials being $V_{A1}$ and $V_{B1}$.

The transfer electrode $G_{01}$ is at constant voltage $V_O$ through switch $I_2$. A reference surface potential $\phi_{ref}$ is thus established beneath the said electrode.

By means of switch $I_3$, electrodes $G_{02}$ and $G_3$ are raised to the polarization voltage of the substrate $V_{sub}$.

Thus, a weak surface potential $\phi_{sub}$ is created beneath $G_{02}$ and $G_3$.

At time $t_1$, signal $V_D$ applied to diode D passes from $V_{D1}$ to $V_{D2}$ and then returns to $V_{D1}$, voltages $V_{D1}$ and $V_{D2}$ being respectively higher and lower than the surface potential $\phi_{ref}$, beneath transfer electrode $G_{01}$.

The level of the charges beneath $G_1$, $G_{01}$ and D, when diode D receives voltage $V_{D2}$ is shown by broken lines in FIG. 1a. When the diode D again receives voltage $V_{D1}$, the level of the charges beneath electrode $G_1$ decreases and a reference charge quantity $Q_{ref}$ is stored beneath electrode $G_1$. The surface potential beneath electrode $G_1$ is fixed at value $V_{A2}$ equal to $\phi_{ref}$ by transfer electrode $G_{01}$.

FIG. 1b shows the various surface potentials in the substrate at time $t_2$. At time $t_2$, switches $I_1$, $I_2$ and $I_3$ are in the position opposite to that shown in FIG. 1a. At time $t_2$, switch $I_1$ is open and point P is left floating.

Switch $I_2$ is connected to the polarization voltage of substrate $V_{sub}$. The surface potential below transfer electrode $G_{01}$ is therefore fixed at $\phi_{sub}$.

Switch $I_3$ is connected to the constant voltage $V_0$. The surface potential below transfer electrode $G_{02}$ is thus fixed at $\phi_{ref}$. The surface potential below the storage electrode $G_3$ is fixed, due to the thickness difference of the oxide on which the electrodes $G_{02}$ and $G_3$ are deposited at a level higher than $\phi_{ref}$.

When a charge quantity $Q_e$ arrives under storage electrode $G_2$, the surface potential below this electrode varies and passes from $V_{B1}$ to $V_{B2}$. As point P is left floating, this surface potential variation is transmitted to storage electrode $G_1$. The surface potential below the storage electrode $G_1$ is fixed at level $\phi_{ref}$, by transfer electrode $G_{02}$. Thus, there is a transfer of a charge quantity from $G_1$ to below the storage electrode $G_3$. It is demonstrated that the charge quantity transferred beneath $G_3$ is equal to $Q_e$ and consequently the charge quantity remaining below $G_1$ is equal to $Q_{ref} - Q_e$.

The embodiment of the device according to the invention shown in FIG. 1a thus makes it possible to generate beneath the storage electrode $G_3$ a charge quantity equivalent to that arriving under electrode $G_2$. It is also possible to eliminate the surplus charge quantity $Q_e$ by transmitting it beneath diode D. For this purpose, it is merely necessary to maintain the transfer electrode $G_{02}$ at voltage $V_{sub}$ and transfer electrode $G_{01}$ at voltage $V_0$ for times $t_1$ and $t_2$.

In order that the surface potential beneath electrode $G_1$ is maintained constant during the arrival of the charge quantity $Q_e$ beneath $G_2$, it is necessary that the voltages applied respectively at time $t_1$ to electrode $G_{01}$ and at time $t_2$ to electrode $G_{02}$ are equal, this applies in the case where a charge quantity $Q_e$ is transferred beneath $G_3$; in the case where a charge quantity $Q_e$ is transferred beneath the diode D, the voltages applied to $G_{01}$ at times $t_1$ and $t_2$ have to be constant.

However, the voltage $V_P$ at which point P is connected at time $t_1$, said voltage being $V_P$, can differ from the voltage $V_O$ making it possible to establish the reference potential $\phi_{ref}$ beneath electrode $G_{01}$. When $V_P$ is equal to $V_O$, the device according to the invention is simplified and its accuracy increased.

FIG. 2 shows a circuit diagram for the embodiment of the invention shown in FIG. 1a. Capacitances $C_A$ and $C_B$ represent the oxide capacitances of electrode $G_1$ and $G_2$. Capacitances $D_A$ and $D_B$ represent the depletion capacitances of electrodes $G_1$ and $G_2$. In the diagram of FIG. 2, capacitances $D_A$ and $D_B$ are connected to earth, which constitutes the dynamic reference of the device according to the invention. A and B are the respective connection points of capacitances $C_A$ and $D_A$ and capacitances $C_B$ and $D_B$.

The charge relationships at points A, B and P are written:

at time $t_1$, after injecting the reference charge quantity $Q_{ref}$ beneath $G_1$:

Sum of the charges at
$A = \phi_{ref} D_A + (\phi_{ref} - V_O) \cdot C_a = Q_{ref}$ Sum of the charges at
$B = V_{B1} \cdot D_B + (V_{B1} - V_O) \cdot C_B = 0$ Sum of the charges at
$P = (V_O - \phi_{ref}) \cdot C_A + (V_O - V_B) \cdot C_B = Q_P$ at time $t_2$ Sum of the charges at
$A = \phi_{ref} D_A + (\phi_{ref} - V_F) \cdot C_A = Q_S$ Sum of the charges at
$B = V_{B2} \cdot D_B + (V_{B2} - V_F) \cdot C_B = Q_e$ Sum of the charges at
$P = (V_F - \phi_{ref}) \cdot C_A + (V_F - V_{B2}) \cdot C_B + Q_P$ In the above $V_S$ and $Q_S$ represent the voltage at point P and the charge quantity remaining beneath $G_1$ at time $t_2$ when charge quantity $Q_e$ has passed beneath $G_2$.

The solving of the six above equations makes it possible to establish the following expression of $Q_S$:

$$Q_S = Q_{ref} - Q_e \cdot \frac{1}{1 + \frac{D_B}{C_A} + \frac{D_B}{C_B}}$$

Thus, by taking the depletion capacitance $D_B$ as being well below the oxide capacitances $C_A$ and $C_B$, as is generally the case, the following equation is proved:

$$Q_S = Q_{ref} - Q_e \qquad (1)$$

Subtraction has taken place between the reference charge quantity $Q_{ref}$ and the charge quantity $Q_e$ and consequently so has the generation of a charge quantity equivalent to $Q_e$.

It is possible to reduce the size of the depletion capacitance $D_B$ compared with oxide capacitances $C_A$ and $C_B$ by using an only slightly doped substrate of the order of $5 \cdot 10^{14}$ cm$^{-3}$.

It is possible to arrive at a circuit diagram for the device according to the invention and similar to that shown in FIG. 2 in the case where n storage electrodes $G_{21}$ to $G_{2n}$ are electrically connected at point P to the first storage electrode $G_1$. The setting down of the charge equations makes it possible to establish that:

$$Q_S = Q_{ref} - \sum_{i=1}^{n} Q_{ei}, \qquad (2)$$

$Q_{ei}$ representing the charge quantity arriving beneath an electrode $G_{2i}$ at time $t_2$. Thus, the device according to the invention makes it possible to carry out the subtraction between a reference charge quantity $Q_{ref}$ and a charge quantity $$\sum_{i=1}^{n} Q_{ei}.$$

A charge quantity equivalent to n charge quantities $Q_{e1}$ to $Q_{en}$ is also generated.

As in the case where the device only has a single storage electrode $G_2$ (equation 1) it is only possible to use equation (2) when the depletion capacitances are very small compared with the oxide capacitances, which is generally the case.

Setting down the charge equations at point A at time $t_1$ before and after the injection of the reference charge quantity $Q_{ref}$ makes it possible to obtain the following equation of $Q_{ref}$:

$$Q_{ref} = (\phi_{ref} - V_{A1}) \cdot (C_A + D_A)$$

It is therefore apparent that $Q_{ref}$ is proportional to $C_A + D_A$, i.e. to the surface $S_1$ of storage electrode $G_1$ for a given value $V_O$. Obviously, the reference charge quantity $Q_{ref}$ must be greater than the maximum value of $$\sum_{i=1}^{n} Q_{ei},$$

$V_O$ and $S_1$ must be determined by taking account of this condition.

FIG. 3 shows another circuit diagram relative to the embodiment of the device according to the invention shown in FIG. 1a. At point P, is shown the stray capacitance $C_P$, which is more particularly due to the covering of the transfer and storage electrodes and to the MOS transistor which is connected to point P for replacing switch $I_1$. Diode d which is connected to point A and is shown in broken line form, indicates that the device according to the invention only operates when charges are supplied and then reduction in the surface potential below electrode $G_2$.

The potential variations at point B and P, $\Delta V_B$ and $\Delta V_F$ are written:

$$\Delta V_B = \frac{Q_e}{D_B + \frac{C_B(C_A + C_P)}{C_B + C_A + C_P}} \text{ and}$$

$$\Delta V_F = \Delta V_B \cdot \frac{C_B}{C_B + C_A + C_P}$$

These equations make it possible to establish the variation of the charges at point A:

$$\Delta Q_A = C_A \cdot \Delta V_F = Q_{ref} - Q_S Q_e \cdot \frac{C_A}{C_A + C_P}, \quad (3)$$

in which $Q_S$ represents the quantity of charges beneath $G_1$ after the arrival of $Q_S$ beneath $G_2$.

The depletion capacitance $D_B$ must obviously be negligibly small compared with the oxide capacitances for the above equation to be proved.

Thus, with regard to equation (3) it can be seen that the device according to the invention is carried out by the subtraction between $Q_{ref}$ and $Q_e$ and the generation of $Q_e$, provided that the stray capacitance $C_P$ is negligible compared with the oxide capacitance $C_A$. The same condition must be proved in the case of a device having n capacitances $G_{21}$ to $G_{2n}$ connected to $G_1$.

What is claimed is:

1. A subtraction and charge quantity generation charge transfer device ensuring the subtraction of n charge quantities from a reference charge quantity and the generation of a charge quantity equivalent to the n charge quantities and comprising a semiconductor substrate in which charges are stored, wherein it comprises a first storage electrode electrically connected at a point to n other storage electrodes, means ensuring the injection beneath the first storage electrode of the reference charge quantity prior to the arrival of the charges beneath the n storage electrodes and when the said point is at a constant voltage and means which maintain a constant surface potential beneath the first storage electrode during the arrival of the charges beneath the n storage electrodes and when the said point is left floating.

2. A device according to claim 1, wherein the means ensuring the injection of the reference charge quantity beneath the first storage electrode are constituted by two charge transfer electrodes surrounding the first storage electrode, the two transfer electrodes being raised to different voltages, and by a charge injection diode implanted in the semiconductor substrate following the transfer electrode raised to the higher voltage, said injection diode being successively raised to a voltage which is lower and then higher than the surface potential beneath the transfer voltage raised to the higher voltage.

3. A device according to claim 2, wherein the means which maintain a constant surface potential beneath the first storage electrode are constituted by the two charge transfer electrodes surrounding the first storage electrode, one of the transfer electrodes being raised to the higher voltage and the other transfer electrode being raised to a lower voltage, and by a storage electrode or an injection diode following the transfer electrode raised to the higher voltage, the surface potential beneath the storage electrode or beneath the diode being higher than the surface potential beneath the transfer electrode raised to the higher voltage.

4. A device according to claim 3, wherein the constant voltage of the said point where the first storage electrode is connected to n other storage electrodes is identical to the voltage of the said transfer electrode raised to the higher voltage.

5. A device according to claim 1, wherein the semiconductor substrate is weakly doped at approximately $5 \cdot 10^{14}$ cm$^{-3}$.

* * * * *